United States Patent
Yang

(10) Patent No.: US 7,505,333 B2
(45) Date of Patent: Mar. 17, 2009

(54) HIGH VOLTAGE DETECTING CIRCUIT FOR SEMICONDUCTOR MEMORY DEVICE AND METHOD OF CONTROLLING THE SAME

(75) Inventor: Hui-Kap Yang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 112 days.

(21) Appl. No.: 11/748,999

(22) Filed: May 15, 2007

(65) Prior Publication Data
US 2007/0268757 A1 Nov. 22, 2007

(30) Foreign Application Priority Data
May 19, 2006 (KR) ............... 10-2006-0045107

(51) Int. Cl.
*G11C 5/14* (2006.01)
(52) U.S. Cl. ............... 365/189.09; 365/189.11; 365/222
(58) Field of Classification Search ........... 365/189.09, 365/189.11, 222
See application file for complete search history.

(56) References Cited

U.S. PATENT DOCUMENTS 5,608,677 A * 3/1997 Yoon et al. ......... 365/189.09
5,898,625 A * 4/1999 Manning ............ 365/189.09
6,172,932 B1   1/2001 Kim

FOREIGN PATENT DOCUMENTS

| KR | 2000-0009108 | 2/2000 |
| KR | 2001-0108681 | 12/2001 |
| KR | 2003-0090535 | 11/2003 |

OTHER PUBLICATIONS

English language abstract of Korean Publication No. 2000-0009108.
English language abstract of Korean Publication No. 2001-0108681.
English language abstract of Korean Publication No. 2003-0090535.

* cited by examiner

*Primary Examiner*—Huan Hoang
(74) *Attorney, Agent, or Firm*—Marger Johnson & McCollom, P.C.

(57) ABSTRACT

Provided are a boosted voltage detecting circuit capable of reducing the consumption of current and reducing ripple in boosted voltage during a self-refresh operation of a semiconductor memory device, and a method of controlling the same. One embodiment of the boosted voltage detecting circuit includes a feedback unit feeding back a boosted voltage, a reference voltage receiving unit receiving a reference voltage, and a detection signal generating unit comparing output voltages received from the feedback and reference voltage receiving units and generating a detection signal according to the result of comparison.

24 Claims, 4 Drawing Sheets

HIGH VOLTAGE DETECTING CIRCUIT FOR SEMICONDUCTOR MEMORY DEVICE AND METHOD OF CONTROLLING THE SAME

CROSS-REFERENCE TO RELATED PATENT APPLICATIONS

This application claims the priority of Korean Patent Application No. 10-2006-0045107, filed on May 19, 2006, in the Korean Intellectual Property Office, the disclosure of which is incorporated herein in its entirety by reference.

BACKGROUND

1. Field of the Invention

The present invention relates to a semiconductor device, and more particularly, to a circuit for detecting boosted voltage in a semiconductor device and a method of controlling the same.

2. Description of the Related Art

In general, a semiconductor memory device includes a boosted voltage generating circuit that generates a boosted voltage that is greater than the external supply voltage, and a boosted voltage detecting circuit that controls the boosted voltage generating circuit. A boosted voltage is mainly used as supply voltage when word lines in a semiconductor memory device are activated. An example of the boosted voltage generating circuit is disclosed in U.S. Pat. No. 6,172,932 B1.

FIG. 1 is a circuit diagram of a conventional boosted voltage generating circuit 11 and circuits related thereto, which are included in a semiconductor memory device. As illustrated in FIG. 1, the boosted voltage generating circuit 11 is controlled by a boosted voltage detecting circuit 13 and an oscillator 15. The boosted voltage generating circuit 11 generates a boosted voltage VPP in response to an oscillation signal OSC. The boosted voltage detecting circuit 13 detects the boosted voltage VPP and generates detection signal VPPOSCE in response to the detected boosted voltage VPP and a reference voltage VREFA. The oscillator 15 generates an oscillation signal OSC in response to the detection signal VPPOSCE.

More specifically, as illustrated in FIGS. 2A and 2B, the boosted voltage detecting circuit 13 generates a control signal for rebooting the boosted voltage VPP. In other words, a detection signal VPPOSCE is generated by the boosted voltage detecting circuit 13 when the boosted voltage VPP reaches or drops below a target voltage TARGET-VPP and reaches a predetermined level VPP(MIN).

FIGS. 2A and 2B are waveform diagrams of a boosted voltage VPP changing in response to a detection signal VPPOSCE. FIG. 2A illustrates a case where the response speed of the boosted voltage detecting circuit 13 illustrated in FIG. 1 is high, and FIG. 2B illustrates a case where the response speed of the boosted voltage detecting circuit 13 is low.

In general, during a self-refresh operation, all of word lines are activated in a semiconductor memory device and thus the amount of a boosted voltage VPP and current consumed is greater than in an active operation. Thus, in order to reduce the consumption of current during the self-refresh operation, it is required to reduce the amount of current that is to be consumed by the boosted voltage detecting circuit 13.

However, in this case, since the response speed of the boosted voltage detecting circuit 13 is slow (T1<T2) as illustrated in FIG. 2B, a ripple VPP(MAX)-VPP(MIN) in the boosted voltage VPP is increased. An increase in the ripple of the boosted voltage VPP results in an increase in the average value of the boosted voltage VPP, thus increasing the amount of current consumed in generating the boosted voltage VPP.

SUMMARY

Embodiments of the present invention provide a boosted voltage detecting circuit capable of reducing the consumption of current and ripple in a boosted voltage during a self-refresh operation. These embodiments may additionally provide a semiconductor memory device having the boosted voltage detecting circuit, and a method of controlling the boosted voltage detecting circuit.

According to an embodiment of the present invention, a boosted voltage detecting circuit, which detects a boosted voltage generated by a boosted voltage generating circuit and generates a detection signal for controlling the boosted voltage generating circuit, includes a feedback unit, a reference voltage receiving unit, and a detection signal generating unit. The feed back unit feeds back the boosted voltage, and the reference voltage receiving unit receives a reference voltage. Meanwhile, the detection signal generating unit compares an output voltage received from the feedback unit and an output voltage received from the reference voltage receiving unit, and generates the detection signal according to the result of comparison. The amount of current varies depending on state of the detection signal, thus changing a response time of the boosted voltage detecting circuit.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION

Figure 1:
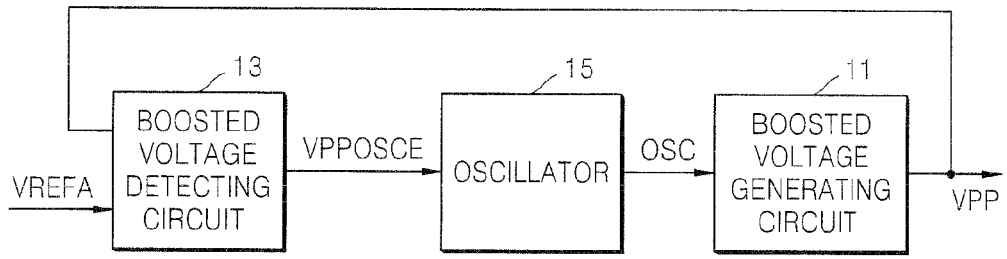
FIG. 1 is a circuit diagram of a conventional boosted voltage generating circuit and circuits related thereto, which are included in a semiconductor memory device.
Figure 2A:
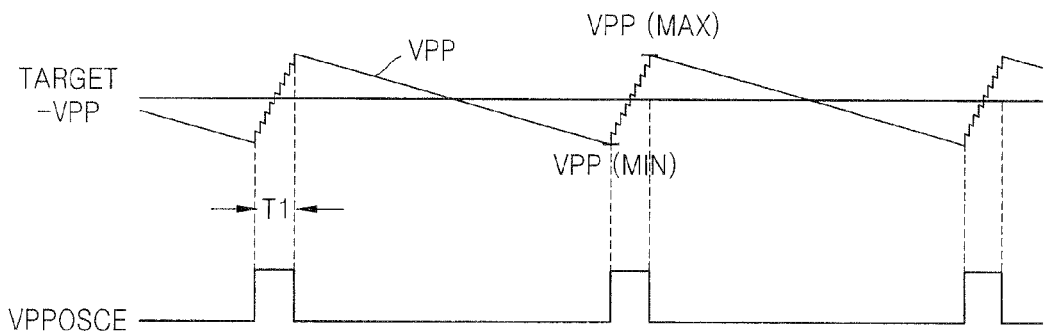
FIGS. 2A and 2B are waveform diagrams of a boosted voltage changing in response to a detection signal.
Figure 2B:
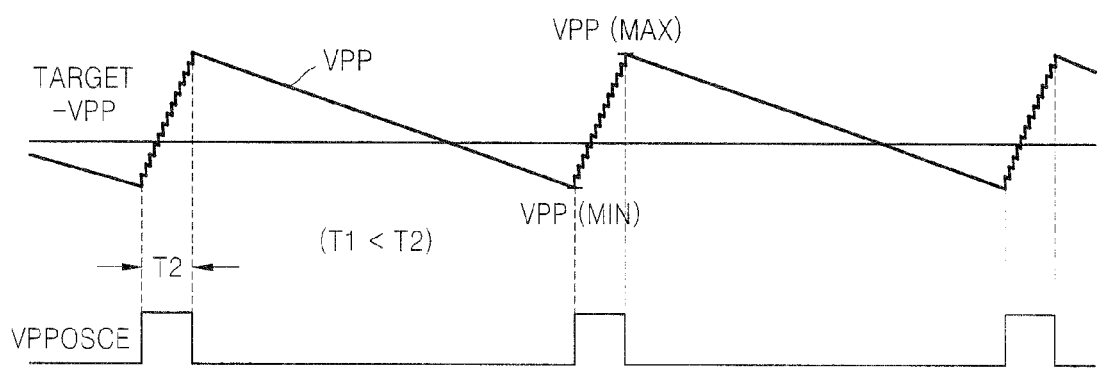

Hereinafter, exemplary embodiments of the present invention will be described in detail with reference to the accompanying drawings. Like reference numerals denote like elements throughout the drawings.

Figure 3:
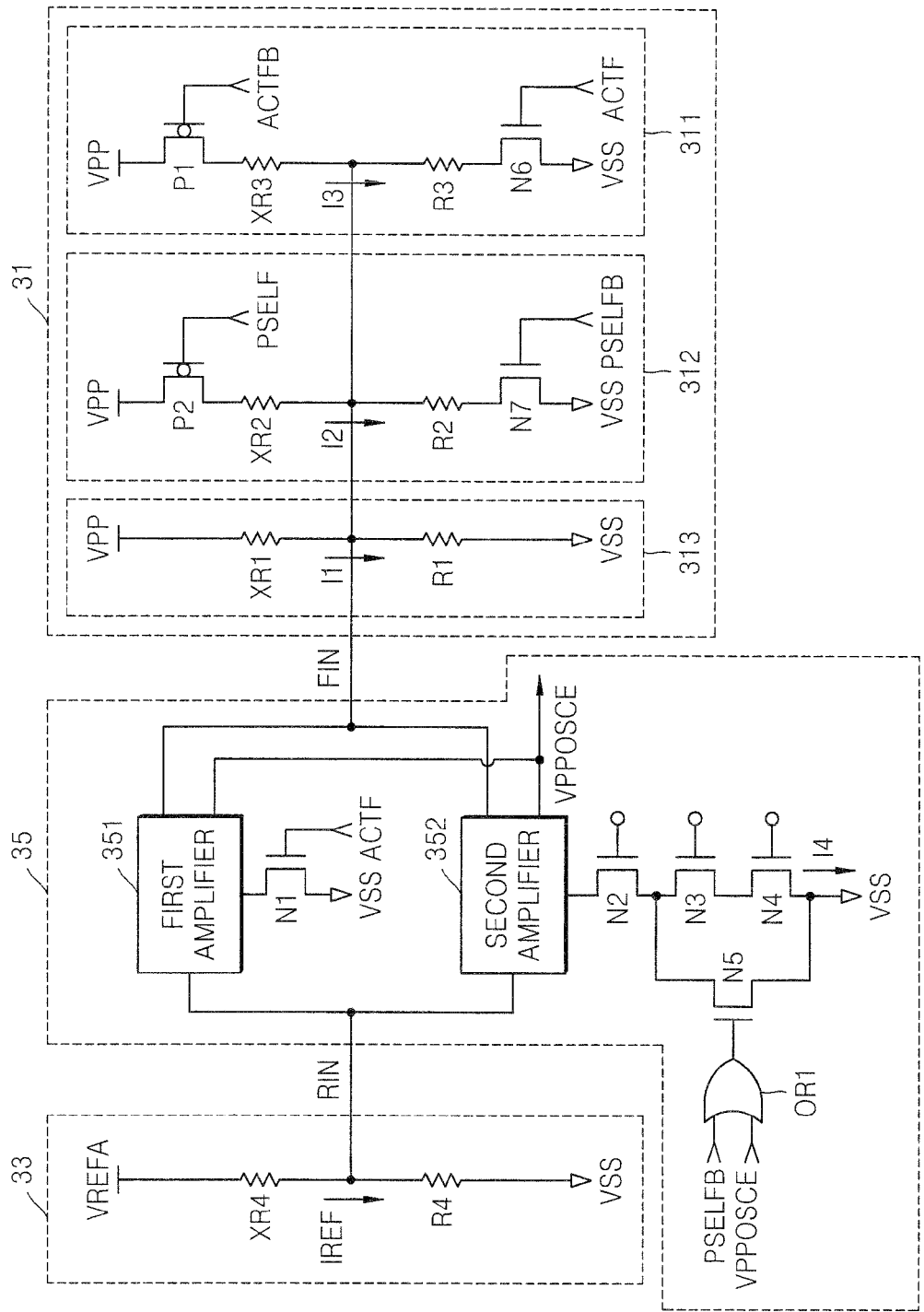
FIG. 3 is a circuit diagram of boosted voltage detecting circuit included in a semiconductor memory device according to an embodiment of the present invention.

FIG. 3 is a circuit diagram of a boosted voltage detecting circuit in a semiconductor memory device according to an embodiment of the present invention. Referring to FIG. 3, the boosted voltage detecting circuit includes a feedback unit 31 that feeds back a boosted voltage VPP, a reference voltage receiving unit 33 that receives a reference voltage VREFA, and a detection signal generating unit 35 that compares an output voltage FIN received from the feedback unit 31 and an output voltage RIN received from the reference voltage receiving unit 33 and generates a detection signal VPPOSCE according to the result of the comparison.

In particular, during a self-refresh mode of a semiconductor memory device, in the boosted voltage detecting circuit according to an embodiment of the present invention, the amount of current I4 that is used to operate (or that is consumed by) the detection signal generating unit 35 varies depending on the state of a detection signal VPPOSCE, thereby changing the response time of the boosted voltage detecting circuit. That is, the amount of current I4 consumed by the detection signal generating unit 35 in a section in which the detection signal VPPOSCE is enabled to logic "high" is greater than in a section in which the detection signal VPPOSCE is disabled to logic "low," thereby shortening the response time of the detection signal generating unit 35. As a result, the response time of the boosted voltage detecting circuit may be reduced.

More specifically, the detection signal generating unit 35 includes a first differential amplifier 351 that operates only during an active mode of the semiconductor memory device, and a second differential amplifier 352 that operates only during a standby mode or a self-refresh mode of the semiconductor memory device. During the active mode of the semiconductor memory device, an active mode signal ACTF is enabled to logic "high," thus turning on an NMOS transistor N1 connected to the first differential amplifier 351. Thus, during the active mode, the first differential amplifier 351 differentially amplifies the output voltage FIN received from the feedback unit 31 and an output voltage RIN received from the reference voltage receiving unit 33, and outputs a detection signal VPPOSCE as the result of amplification.

During the standby mode of the semiconductor memory device, an inversion signal PSELFB of a self-refresh mode signal PSELF is enabled to logic "high," and thus, an NMOS transistor N5 connected to the second differential amplifier 352 is turned on in response to a signal output from an OR gate OR1. In this case, NMOS transistors N2 through N4 connected in series to the second differential amplifier 352 have already been turned on. Thus, during the standby mode, the second differential amplifier 352 differentially amplifies the output voltage FIN received from the feedback unit 31 and the output voltage RIN received from the reference voltage receiving unit 33 and outputs the detection signal VPPOSCE as the result of amplification.

During the self-refresh mode of the semiconductor memory device, in which the inversion signal PSELFB goes low, the second differential amplifier 352 differentially amplifies the output voltage FIN received from the feedback unit 31 and the output voltage RIN received from the reference voltage receiving unit 33 and outputs the detection signal VPPOSCE as the result of the amplification and in response to the detection signal VPPOSCE received by OR gate OR1. During the self-refresh mode where the inversion signal PSELFB goes low, the NMOS transistor N5 connected to the second differential amplifier 352 is turned off in response to the signal output from the OR gate OR1 in a section where the detection signal VPPOSCE is disabled to logic "low." Also, during the self-refresh mode where the inversion signal PSELFB goes low, the NMOS transistor N5 is turned on in response to the signal output from the OR gate OR1 in a section where the detection signal VPPOSCE is enabled to logic "high." In this case, the NMOS transistors N2 through N4 connected in series to the second differential amplifier 352 have already been turned on.

Accordingly, the amount of current I4 consumed by the second differential amplifier 352 in a section where the detection signal VPPOSCE is enabled is greater than in a section where the detection signal VPPOSCE is disabled. Thus, the response time of the second differential amplifier 352 in the section where the detection signal VPPOSCE is enabled is shorter than in the section where the detection signal VPPOSCE is disabled. As a result, the response time of the detection signal generating unit 35 is shortened, thereby reducing the response time of the boosted voltage detecting circuit.

The feedback unit 31 includes a first voltage distributing unit 311 that receives and distributes the boosted voltage VPP in response to an active mode signal ACTF and an inversion signal ACTFB of the active mode signal ACTF, a second voltage distributing unit 312 that receives and distributes the boosted voltage VPP in response to the self-refresh mode signal PSELF and the inversion of the self-refresh mode signal PSELFB, and a third voltage distributing unit 313 that receives and distributes the boosted voltage VPP regardless of the above mode signals. All of the output nodes of the first through third voltage distributing units 311 through 313 are connected to a node to which the output voltage FIN from the feedback unit 31 is output.

The first voltage distributing unit 311 includes a PMOS transistor P1, a resistor XR3, a resistor R3, and an NMOS transistor N6. The second voltage distributing unit 312 includes a PMOS transistor P2, a resistor XR2, a resistor R2, and an NMOS transistor N7. The third voltage distributing unit 313 includes a resistor XR1 and a resistor R1.

During the active mode of the semiconductor memory device, the active mode signal ACTF is enabled to logic "high" and the self-refresh mode signal PSELF is disabled to logic "low." Also, the inversion signal ACTFB of the active mode signal ACTF goes low and the inversion signal PSELFB of the self-refresh mode signal PSELF goes high. Thus, all of the PMOS transistors P1 and P2 and the NMOS transistors N6 and N7 are turned on. Accordingly, all of the first through third voltage distributing units 311 through 313 operate during the active mode.

During the self-refresh mode of the semiconductor memory device, the active mode signal ACTF is disabled to logic "low" and the self-refresh mode signal PSELF is enabled to logic "high." Also, the inversion signal ACTFB of the active mode signal ACTF goes high and the inversion signal PSELFB of the self-refresh mode signal PSELF goes low. Thus, all of the PMOS transistors P1 and P2 and the NMOS transistors N6 and N7 are turned off. Therefore, only the third voltage distributing unit 313 operates during the self-refresh mode.

During the standby mode of the semiconductor memory device, both the active mode signal ACTF and the self-refresh mode signal PSELF are disabled to logic "low." Further, both the inversion signal ACTFB of the active mode signal ACTF and the inversion signal PSELFB of the self-refresh mode signal PSELF go high. Thus, the PMOS transistor P1 and the NMOS transistor N6 are turned off, and the PMOS transistor P2 and the NMOS transistor N7 are turned on. Accordingly, only the second and third voltage distributing units 312 and 313 operate during the self-refresh mode.

The reference voltage receiving unit 33 includes a voltage distributing unit having a resistor XR4 and a resistor R4. The reference voltage receiving unit 33 receives and distributes the reference voltage VREFA and generates the output voltage RIN.

Figure 4:
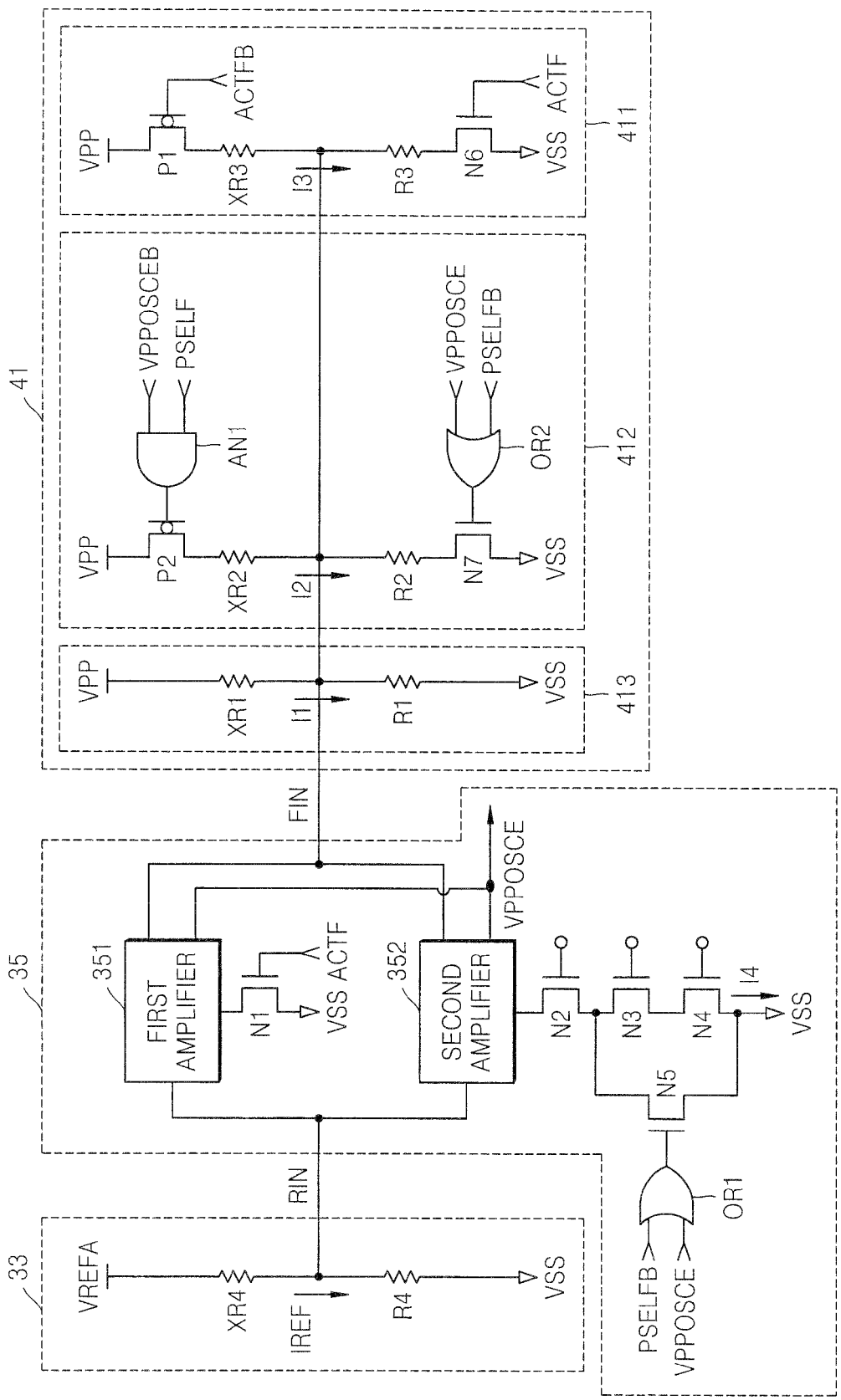
FIG. 4 is a circuit diagram of a boosted voltage detecting circuit according to another embodiment of the present invention.

FIG. 4 is a circuit diagram of a boosted voltage detecting circuit according to another embodiment of the present invention. Referring to FIG. 4, the boosted voltage detecting circuit includes a reference voltage receiving unit 33, a detection signal generating unit 35, and a feedback unit 41. The reference voltage receiving unit 33 and the detection signal generating unit 35 are respectively the same as the reference voltage receiving unit 33 and the detection signal generating unit 35 illustrated in FIG. 3. However, the feedback unit 41 has a different construction from that of the feedback unit 31 illustrated in FIG. 3. Accordingly, a detailed description of the reference voltage receiving unit 33 and the detection signal generating unit 35 of FIG. 4 will be omitted.

The feedback unit 41 includes a first voltage distributing unit 411, a second voltage distributing unit 412, and a third voltage distributing unit 413. The first voltage distributing unit 411 and the third voltage distributing unit 413 are respectively similar to the first voltage distributing unit 311 and the third voltage distributing unit 313 illustrated in FIG. 3. The second voltage distributing unit 412 also has some similarities to the second voltage distributing unit 312 illustrated in FIG. 3. However, the second voltage distributing unit 412 of FIG. 4 further includes AND gate AN1 that receives a self-refresh mode signal PSELF and an inversion signal VPPOSCEB of a detection signal VPPOSCE, and an OR gate OR2 that receives an inversion signal PSELFB of a self-refresh mode signal PSELF and the detection signal VPPOSCE. A signal output from the AND gate AN1 is applied to a gate of a PMOS transistor P2, and a signal output from the OR gate OR2 is applied to a gate of an NMOS transistor N7.

Accordingly, during a self-refresh mode of the semiconductor memory device, in which the self-fresh mode signal PSELF goes high, the PMOS transistor P2 and the NMOS transistor N7 are turned off in a section where the detection signal VPPOSCE is disabled to logic "low." Thus, only the third voltage distributing unit 313 operates. However, during the self-refresh mode in which the self-refresh mode signal PSELF goes high, the PMOS transistor P2 and the NMOS transistor N7 are turned on in a section where the detection signal VPPOSCE is enabled to logic "high." Therefore, both the second and the third voltage distributing units 412 and 413 operate.

Therefore, in the boosted voltage detecting circuit, illustrated in FIG. 4, according to another embodiment of the present invention, the amounts of current consumed by the detection signal generating unit 35 and the feedback unit 41 vary depending on the state of the detection signal VPPOSCE in the self-refresh mode of the semiconductor memory device, thus changing the response time of the boosted voltage detecting circuit. That is, the amount of current I4 consumed by the detection signal generating unit 35 and the amount of current I1+I2 consumed by the feedback unit 41 are increased in the section where the detection signal VPPOSCE is enabled to logic "high," thereby reducing the response time of the boosted voltage detecting circuit.

Figure 5:
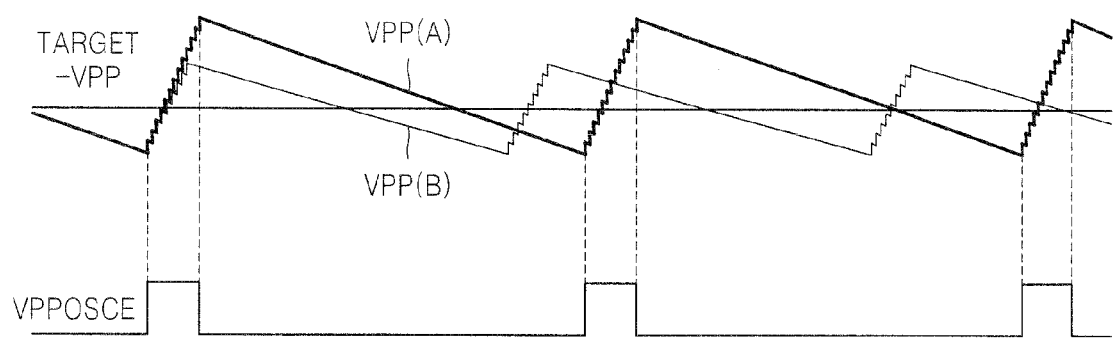
FIG. 5 is a waveform diagram of a boosted voltage changing in the boosted voltage detecting circuit illustrated in FIG. 3 or FIG. 4 in response to a detection signal, according to an embodiment of the present invention.

FIG. 5 is a waveform diagram of a boosted voltage VPP changing in the boosted voltage detecting circuit illustrated in FIG. 3 or FIG. 4 in response to a detection signal VPPOSCE, according to an embodiment of the present invention. In FIG. 5, VPP(A) denotes the waveform of the boosted voltage VPP when the detection signal VPPOSCE is not applied to the detection signal generating unit 35 and the feedback unit 41 during a self-refresh mode. VPP(B) denotes the waveform of the boosted voltage VPP when the amount of current consumed by the detection signal generating unit 35 and/or the feedback unit 41 is increased by applying the detection signal VPPOSCE to the detection signal generating unit 35 and/or the feedback unit 41 in a section where the detection signal VPPOSCE is enabled to logic "high," during the self-refresh mode.

As illustrated in FIG. 5, the response time of the boosted voltage detecting circuit is reduced when the amount of current consumed by the detection signal generating unit 35 and/or the feedback unit 41 is increased in the section where the detection signal VPPOSCE is enabled to logic "high," thereby reducing a ripple in the boosted voltage VPP(B). When the ripple in the boosted voltage VPP(B) is reduced, the average level of the boosted voltage VPP(B) is lowered, thus reducing the amount of current consumed to generate the boosted voltage VPP(B). Therefore, the overall consumption of current is reduced during the self-refresh operation.

In this disclosure, a boosted voltage detecting circuit according to the present invention has been described with respect to a self-refresh mode of a semiconductor memory device, but may be applicable even during a normal mode of the semiconductor memory device.

As described above, a boosted voltage detecting circuit and a method of controlling the same according to the present invention are capable of reducing the consumption of current and a ripple in a boosted voltage during a self-refresh operation of a semiconductor memory device.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A boosted voltage detecting circuit configured to detect a boosted voltage generated by a boosted voltage generating circuit and generate a detection signal for controlling the boosted voltage generating circuit, the boosted voltage detecting circuit comprising:
   a feedback unit configured to receive the boosted voltage generated by the boosted voltage generating circuit and generate an output voltage;
   a reference voltage receiving unit configured to receive a reference voltage and generate an output voltage; and
   a detection signal generating unit configured to compare an output voltage received from the feedback unit and an output voltage received from the reference voltage receiving unit and generate the detection signal according to the result of the comparison,
   wherein an amount of current consumed by the boosted voltage detecting circuit and a response time of the boosted voltage detecting circuit vary depending on a state of the detection signal.

2. The circuit of claim 1, wherein the amount of current consumed by the boosted voltage detecting circuit is greater when the detection signal is enabled.

3. The circuit of claim 1, wherein the amount of current consumed by the detection signal generating unit varies depending on the state of the detection signal.

4. The circuit of claim 3, wherein the detection signal generating unit comprises:
   a first differential amplifier configured to differentially amplify the output voltage received from the feedback unit and the output voltage received from the reference voltage receiving unit and output the detection signal as a result of the amplification during a first operation mode; and
   a second differential amplifier configured to differentially amplify the output voltage received from the feedback unit and the output voltage received from the reference voltage receiving unit and output the detection signal as a result of the amplification and the detection signal during a second operation mode, wherein the amount of current consumed by the second differential amplifier is greater when the detection signal is enabled.

5. The circuit of claim 4, wherein the feedback unit comprises:
a first voltage distributing unit configured to receive and distribute the boosted voltage;
a second voltage distributing unit configured to receive and distribute the boosted voltage; and
a third voltage distributing unit configured to receive and distribute the boosted voltage,
wherein output nodes of the first through third voltage distributing units are connected to a node to which the output voltage from the feedback unit is output, and
the first through third voltage distributing units operate during the first operation mode,
only the third voltage distributing unit operates during the second operation mode, and
only the second and third voltage distributing unit operate during a third operation mode.

6. The circuit of claim 5, wherein the reference voltage receiving unit comprises a voltage distributing unit configured to receive and distribute the reference voltage.

7. The circuit of claim 1, wherein the amount of current consumed by the detection signal generating unit and the feedback unit varies depending on the state of the detection signal.

8. The circuit of claim 7, wherein the detection signal generating unit comprises:
a first differential amplifier configured to differentially amplify the output voltage received from the feedback unit and the output voltage received from the reference voltage receiving unit and output the detection signal as a result of the amplification during a first operation mode; and
a second differential amplifier configured to differentially amplify the output voltage received from the feedback unit and the output voltage received from the reference voltage receiving unit and output the detection signal as a result of the amplification and the detection signal during a second operation mode,
wherein the amount of current consumed by the second differential amplifier is greater when the detection signal is enabled.

9. The circuit of claim 8, wherein the feedback unit comprises:
a first voltage distributing unit configured to receive and distribute the boosted voltage;
a second voltage distributing unit configured to receive and distribute the boosted voltage; and
a third voltage distributing unit configured to receive and distribute the boosted voltage,
wherein output nodes of the first through third voltage distributing units are connected to a node to which the output voltage from the feedback unit is output,
the first through third voltage distributing units operate during the first operation mode,
only the third voltage distributing unit operates during the second mode when the detection signal is disabled and only the second and third voltage distributing units operate during the second mode when the detection signal is enabled, and
only the second and third voltage distributing units operate during a third operation mode.

10. The circuit of claim 9, wherein the reference voltage receiving unit comprises a voltage distributing unit configured to receive and distribute the reference voltage.

11. A semiconductor memory device comprising:
a boosted voltage generating circuit configured to generate a boosted voltage in response to an oscillation signal;
a boosted voltage detecting circuit configured to detect the boosted voltage and generate a detection signal in response to the detected boosted voltage and a reference voltage; and
an oscillator configured to generate the oscillation signal in response to the detection signal,
wherein the boosted voltage detecting circuit comprises:
a feedback unit configured to receive the boosted voltage generated by the boosted voltage generating circuit and generate an output voltage;
a reference voltage receiving unit configured to receive the reference voltage and generate an output voltage; and
a detection signal generating unit configured to compare an output voltage received from the feedback unit and an output voltage received from the reference voltage receiving unit and generate the detection signal according the result of the comparison, and
wherein an amount of current consumed by the boosted voltage detecting circuit and a response time of the boosted voltage detecting circuit vary depending on state of the detection signal during a self-refresh mode.

12. The semiconductor memory device of claim 11, wherein the amount of current consumed by the boosted voltage detecting circuit is greater when the detection signal is enabled.

13. The semiconductor memory device of claim 11, wherein the amount of current consumed by the detection signal generating unit varies depending on the state of the detection signal.

14. The semiconductor memory device of claim 13, wherein the detection signal generating unit comprises:
a first differential amplifier configured to differentially amplify the output voltage received from the feedback unit and the output voltage received from the reference voltage receiving unit and output the detection signal as a result of the amplification during an active mode of the semiconductor memory device; and
a second differential amplifier configured to differentially amplify the output voltage received from the feedback unit and the output voltage received from the reference voltage receiving unit and output the detection signal as a result of the amplification and the detection signal during the self-refresh mode of the semiconductor memory device,
wherein the amount of current consumed by the second differential amplifier is greater when detection signal is enabled.

15. The semiconductor memory device of claim 14, wherein the feedback unit comprises:
a first voltage distributing unit configured to receive and distribute the boosted voltage;
a second voltage distributing unit configured to receive and distribute the boosted voltage; and
a third voltage distributing unit configured to receive and distribute the boosted voltage,
wherein output nodes of the first through third voltage distributing units are connected to a node to which the output voltage from the feedback unit is output,
the first through third voltage distributing units operate during the active mode,
only the third voltage distributing unit operates during the self-refresh mode, and only the second and third voltage distributing units operate during a standby mode of the semiconductor memory device.

16. The semiconductor memory device of claim 15, wherein the reference voltage receiving unit comprises a voltage distributing unit configured to receive and distribute the reference voltage.

17. The semiconductor memory device of claim 11, wherein the amount of current consumed by the detection signal generating unit and the feedback unit varies depending on the state of the detection signal.

18. The semiconductor memory device of claim 17, wherein the detection signal generating unit comprises:
 a first differential amplifier configured to differentially amplify the output voltage received from the feedback unit and the output voltage received from the reference voltage receiving unit and output the detection signal as the result of amplification during an active mode of the semiconductor memory device; and
 a second differential amplifier configured to differentially amplify the output voltage received from the feedback unit and the output voltage received from the reference voltage receiving unit and output the detection signal as the result of amplification and the detection signal during the self-refresh mode of the semiconductor memory device,
 wherein the amount of current consumed by the second differential amplifier is greater when the detection signal is enabled.

19. The semiconductor memory device of claim 18, wherein the feedback unit comprises:
 a first voltage distributing unit configured to receive and distribute the boosted voltage;
 a second voltage distributing unit configured to receive and distribute the boosted voltage; and
 a third voltage distributing unit configured to receive and distribute the boosted voltage,
 wherein output nodes of the first through third voltage distributing unit are connected to a node to which the output voltage from the feedback unit is output,
 the first through third voltage distributing units operate in the active mode,
 only the third voltage distributing unit operates during the self-refresh mode when the detection signal is disabled and the second and third voltage distributing units operate during the self-refresh mode when the detection signal is enabled, and
 the second and third voltage distributing units operate during a standby mode of the semiconductor memory device.

20. The semiconductor memory device of claim 19, wherein the reference voltage receiving unit comprises a voltage distributing unit configured to receive and distribute the reference voltage.

21. A method of controlling a boosted voltage detecting circuit in a semiconductor memory device which includes a boosted voltage generating circuit configured to generate a boosted voltage and a boosted voltage detecting circuit configured to detect the boosted voltage and generate a detection signal for controlling the boosted voltage generating circuit, the method comprising increasing the amount of current that is to be consumed by the boosted voltage detecting circuit when the detection signal is enabled compared to when the detection signal is disabled during a self-refresh mode of the semiconductor memory device.

22. The method of claim 21, wherein generating a detection signal for controlling the boosted voltage generating circuit comprises:
 receiving the boosted voltage at a feedback unit and generating a first output voltage;
 receiving a reference voltage at a reference voltage receiving unit and generating a second output voltage; and
 comparing the first output voltage to the second output voltage at a detection signal generating unit and generating the detection signal according to the result of comparison, and
 wherein increasing of the amount of current that is to be consumed in the boosted voltage detecting circuit comprises increasing the amount of current that is to be consumed by the detection signal generating circuit included in the boosted voltage detecting circuit when the detection signal is enabled.

23. The method of claim 21, wherein generating a detection signal for controlling the boosted voltage generating circuit comprises:
 receiving the boosted voltage at a feedback unit and generating a first output voltage;
 receiving a reference voltage at a reference voltage receiving unit and generating a second output voltage; and
 comparing the first output voltage to the second output voltage at a detection signal generating unit and generating the detection signal according to the result of comparison, and
 wherein increasing of the amount of current that is to be consumed by the boosted voltage detecting circuit comprises increasing the amount of current that is to be consumed by the detection signal generating circuit and the feedback unit when the detection signal is enabled.

24. A boosted voltage detecting circuit comprising:
 a feedback unit configured to receive a boosted voltage generated by a boosted voltage generating circuit and generate a first output voltage;
 a reference voltage receiving unit configured to receive a reference voltage and generate a second output voltage; and
 a detection signal generating unit including a first amplifier and a second amplifier, the detection signal generating unit configured to:
  compare the first output voltage with the second output voltage at the first amplifier and generate a detection signal according to the result of the comparison in an active mode,
  compare the first output voltage with the second output voltage at the second amplifier and generate a detection signal according to the result of the comparison in a standby mode, and
  compare the first output voltage with the second output voltage at the second amplifier and generate a detection signal according the result of the comparison in a self-refresh mode, wherein an amount of current consumed by the boosted voltage detecting circuit and a response time of the boosted voltage detecting circuit increase when the detection signal is enabled during the self-refresh mode.

* * * * *